United States Patent
Cheng et al.

(10) Patent No.: US 12,099,789 B2
(45) Date of Patent: Sep. 24, 2024

(54) FPGA-BASED PROGRAMMABLE DATA ANALYSIS AND COMPRESSION FRONT END FOR GPU

(71) Applicant: Advanced Micro Devices, Inc., Santa Clara, CA (US)

(72) Inventors: Kevin Y. Cheng, Bellvue, WA (US); Sooraj Puthoor, Austin, TX (US); Onur Kayiran, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 517 days.

(21) Appl. No.: 17/118,442

(22) Filed: Dec. 10, 2020

(65) Prior Publication Data
US 2022/0188493 A1    Jun. 16, 2022

(51) Int. Cl.
*G06F 30/331* (2020.01)
*G06F 9/38* (2018.01)
*G06F 30/34* (2020.01)

(52) U.S. Cl.
CPC .......... *G06F 30/331* (2020.01); *G06F 9/3877* (2013.01); *G06F 30/34* (2020.01)

(58) Field of Classification Search
CPC ...... G06F 30/331; G06F 9/3877; G06F 30/34; G06F 15/7871
See application file for complete search history.

(56) References Cited

U.S. PATENT DOCUMENTS

2018/0174268 A1* 6/2018 Bittner ............... G06T 1/60

OTHER PUBLICATIONS

Sano et al. Segment-Parallel Predictor for FPGA-based Hardware Compressor and Decompressor of Floating-Point Data Streams to Enhance Memory I/O Bandwidth IEEE, Data Compression Conference 2010 (Year: 2010).*

* cited by examiner

*Primary Examiner* — Rehana Perveen
*Assistant Examiner* — Cuong V Luu
(74) *Attorney, Agent, or Firm* — Volpe Koenig

(57) ABSTRACT

Methods, devices, and systems for information communication. Information transmitted from a host to a graphics processing unit (GPU) is received by information analysis circuitry of a field-programmable gate array (FPGA). A pattern in the information is determined by the information analysis circuitry. A predicted information pattern is determined, by the information analysis circuitry, based on the information. An indication of the predicted information pattern is transmitted to the host. Responsive to a signal from the host based on the predicted information pattern, the FPGA is reprogrammed to implement decompression circuitry based on the predicted information pattern. In some implementations, the information includes a plurality of packets. In some implementations, the predicted information pattern includes a pattern in a plurality of packets. In some implementations, the predicted information pattern includes a zero data pattern.

20 Claims, 7 Drawing Sheets

FPGA-BASED PROGRAMMABLE DATA ANALYSIS AND COMPRESSION FRONT END FOR GPU

BACKGROUND

In modern microprocessors, such as graphics processing units (GPU), memory bandwidth becomes a constraint on processing efficiency in memory intensive applications, such as machine learning (ML) and artificial intelligence (AI). Memory bandwidth refers to the rate at which information is readable from or stored to a memory. For example, the rate at which information is written to and read from a GPU memory by a GPU is referred to as the memory bandwidth of the GPU in some cases.

A field-programmable gate array (FPGA) is an integrated circuit specifically designed to be configured after manufacturing (i.e., "in the field"). Typical FPGAs include an array of programmable logic blocks and reconfigurable interconnects which can be programmed to connect the logic blocks in different ways.

BRIEF DESCRIPTION OF THE DRAWINGS

A more detailed understanding can be had from the following description, given by way of example in conjunction with the accompanying drawings wherein.

DETAILED DESCRIPTION

Figure 1:
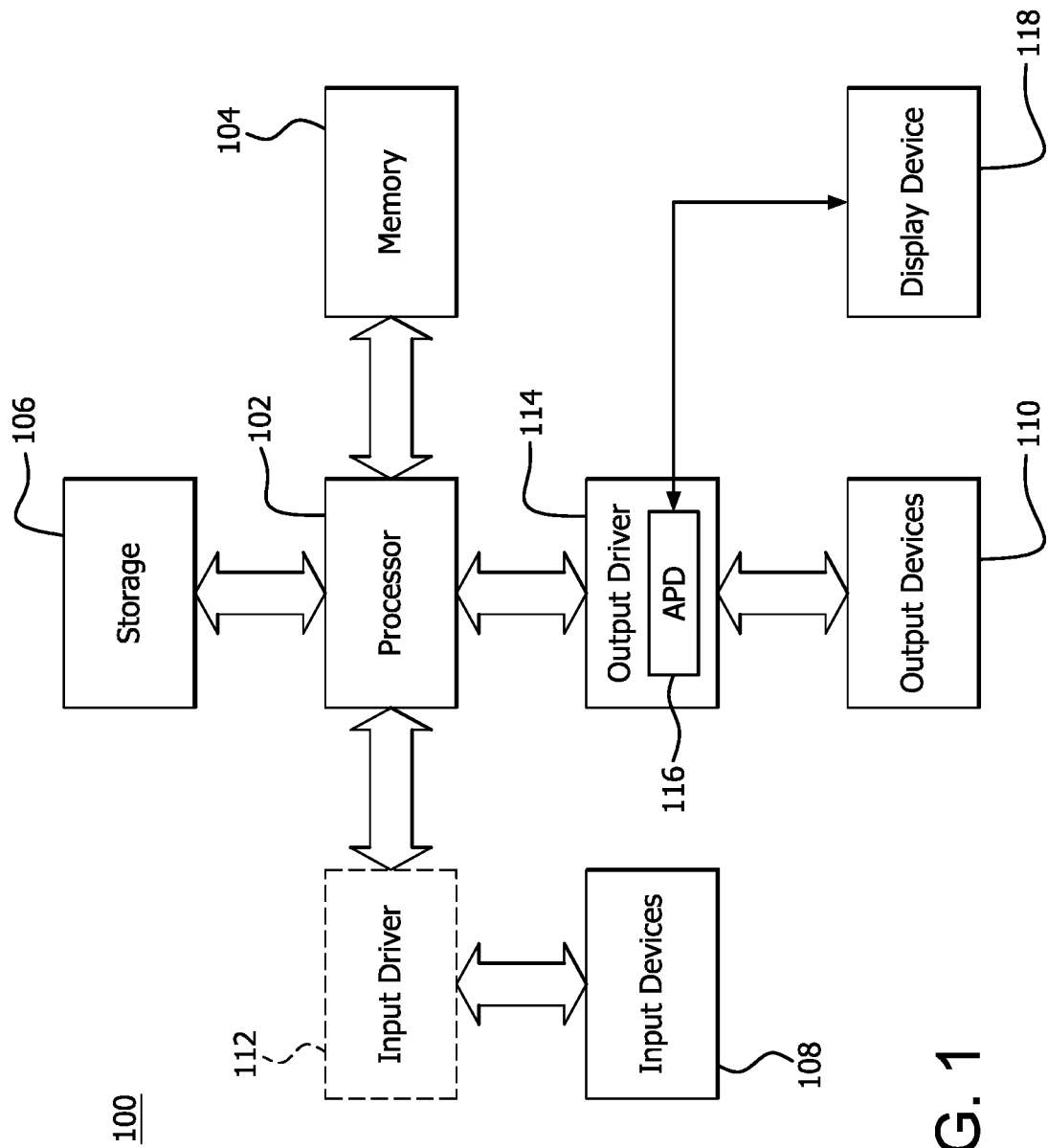
FIG. 1 is a block diagram of an example device in which one or more features of the disclosure can be implemented.

Some implementations provide a method for information communication. Information transmitted from a host to a graphics processing unit (GPU) is received by information analysis circuitry of a field-programmable gate array (FPGA). A pattern in the information is determined by the information analysis circuitry. A predicted information pattern is determined, by the information analysis circuitry, based on the information. An indication of the predicted information pattern is transmitted to the host. Responsive to a signal from the host based on the predicted information pattern, the FPGA is reprogrammed to implement decompression circuitry based on the predicted information pattern.

In some implementations, the information includes a plurality of packets. In some implementations, the predicted information pattern includes a pattern in a plurality of packets. In some implementations, the predicted information pattern includes a zero data pattern. In some implementations, the FPGA is reprogrammed, responsive to the signal from the host, to implement compression circuitry based on the predicted information pattern. In some implementations, information transmitted from the GPU to the host is compressed by the compression circuitry. In some implementations, the FPGA is reprogrammed by the host to implement the decompression circuitry based on the predicted information pattern responsive to the signal. In some implementations, the FPGA reprograms itself, or partially reprograms itself, to implement the decompression circuitry based on the predicted information pattern responsive to the signal. In some implementations, the FPGA is reprogrammed by the host to implement the compression circuitry based on the predicted information pattern responsive to the signal. In some implementations, the FPGA reprograms itself, or partially reprograms itself, to implement the compression circuitry based on the predicted information pattern responsive to the signal.

Some implementations provide a reconfigurable communications device. The reconfigurable communications device includes a FPGA which includes analysis circuitry. The analysis circuitry is configured to receive information from a host to a GPU. The analysis circuitry is also configured to determine a pattern in the information. The analysis circuitry is also configured to determine a predicted information pattern based on the pattern in the information. The analysis circuitry is also configured to transmit an indication of the predicted information pattern to the host. The FPGA is configured to be reprogrammed to implement decompression circuitry based on the predicted information pattern, in response to a signal from the host.

In some implementations, the information includes a plurality of packets. In some implementations, the predicted information pattern includes a pattern in a plurality of packets. In some implementations, the predicted information pattern includes a zero data pattern. In some implementations, the FPGA is configured to be reprogrammed, responsive to the signal from the host, to implement compression circuitry based on the predicted information pattern. In some implementations, the compression circuitry is configured to compress information transmitted from the GPU to the host. In some implementations, the FPGA is configured to be reprogrammed by the host to implement the decompression circuitry based on the predicted information pattern responsive to the signal. In some implementations, the FPGA is configured to reprogram itself, or to partially reprogram itself, to implement the decompression circuitry based on the predicted information pattern responsive to the signal. In some implementations, the FPGA is configured to be reprogrammed by the host to implement the compression circuitry based on the predicted information pattern responsive to the signal. In some implementations, the FPGA is configured to reprogram itself, or to partially reprogram itself, to implement the compression circuitry based on the predicted information pattern responsive to the signal.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 114 includes an accelerated processing device ("APD") 116 which is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and provides graphical output to a display device 118. For example, it is contemplated that any processing system that performs processing tasks in accordance with a SIMD paradigm may perform the functionality described herein. Alternatively, it is contemplated that computing systems that do not perform processing tasks in accordance with a SIMD paradigm performs the functionality described herein.

Figure 2:
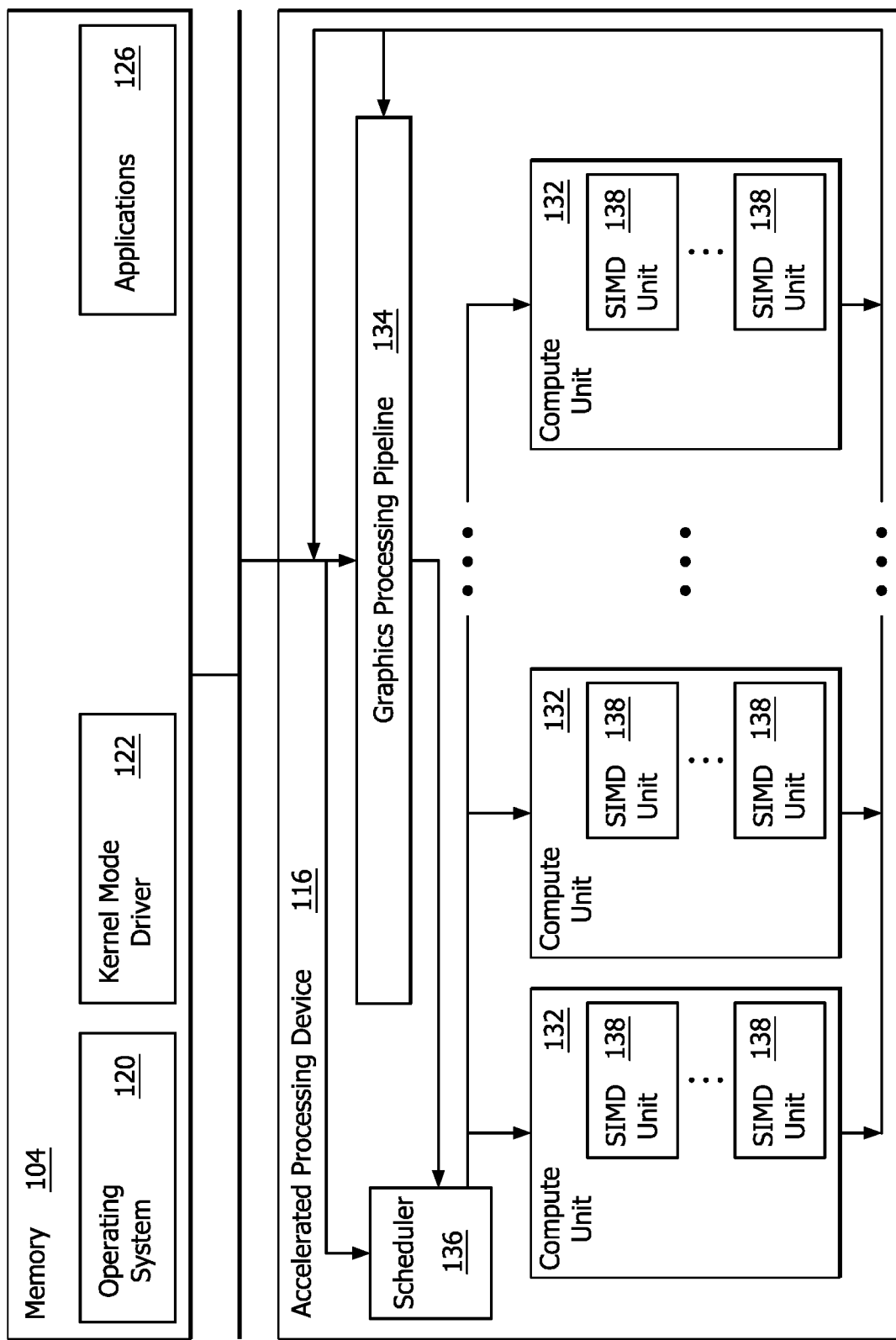
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface ("API") to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Figure 3:
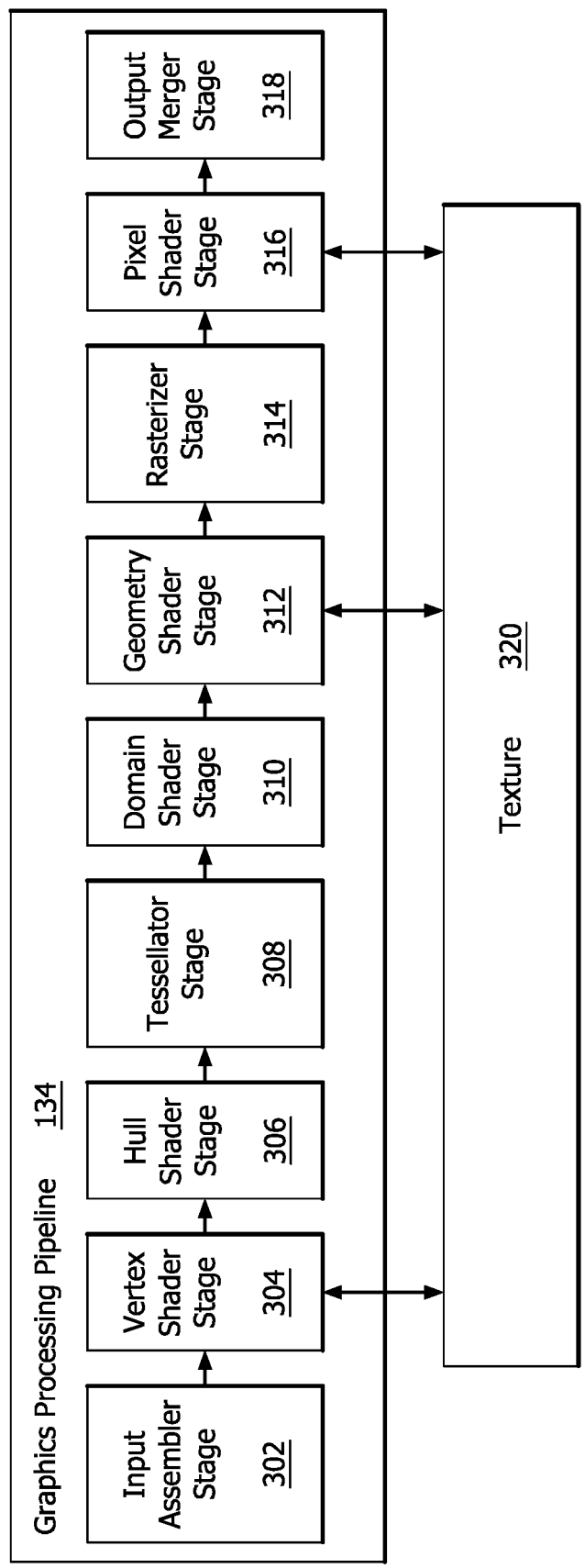
FIG. 3 is a block diagram illustrating a graphics processing pipeline, according to an example.

FIG. 3 is a block diagram showing additional details of the graphics processing pipeline 134 illustrated in FIG. 2. The graphics processing pipeline 134 includes stages that each performs specific functionality. The stages represent subdivisions of functionality of the graphics processing pipeline 134. Each stage is implemented partially or fully as shader programs executing in the programmable processing units 202, or partially or fully as fixed-function, non-programmable hardware external to the programmable processing units 202.

The input assembler stage 302 reads primitive data from user-filled buffers (e.g., buffers filled at the request of software executed by the processor 102, such as an application 126) and assembles the data into primitives for use by the remainder of the pipeline. The input assembler stage 302 can generate different types of primitives based on the primitive data included in the user-filled buffers. The input assembler stage 302 formats the assembled primitives for use by the rest of the pipeline.

The vertex shader stage 304 processes vertexes of the primitives assembled by the input assembler stage 302. The vertex shader stage 304 performs various per-vertex operations such as transformations, skinning, morphing, and per-vertex lighting. Transformation operations include various operations to transform the coordinates of the vertices. These operations include one or more of modeling transformations, viewing transformations, projection transformations, perspective division, and viewport transformations. Herein, such transformations are considered to modify the coordinates or "position" of the vertices on which the transforms are performed. Other operations of the vertex shader stage 304 modify attributes other than the coordinates.

The vertex shader stage 304 is implemented partially or fully as vertex shader programs to be executed on one or more compute units 132. The vertex shader programs are provided by the processor 102 and are based on programs that are pre-written by a computer programmer. The driver 122 compiles such computer programs to generate the vertex shader programs having a format suitable for execution within the compute units 132.

The hull shader stage 306, tessellator stage 308, and domain shader stage 310 work together to implement tessellation, which converts simple primitives into more complex primitives by subdividing the primitives. The hull shader stage 306 generates a patch for the tessellation based on an input primitive. The tessellator stage 308 generates a set of samples for the patch. The domain shader stage 310 calculates vertex positions for the vertices corresponding to the samples for the patch. The hull shader stage 306 and domain shader stage 310 can be implemented as shader programs to be executed on the programmable processing units 202.

The geometry shader stage 312 performs vertex operations on a primitive-by-primitive basis. A variety of different types of operations can be performed by the geometry shader stage 312, including operations such as point sprint expansion, dynamic particle system operations, fur-fin generation, shadow volume generation, single pass render-to-cubemap, per-primitive material swapping, and per-primitive material setup. In some instances, a shader program that executes on the programmable processing units 202 perform operations for the geometry shader stage 312.

The rasterizer stage 314 accepts and rasterizes simple primitives and generated upstream. Rasterization includes determining which screen pixels (or sub-pixel samples) are covered by a particular primitive. Rasterization is performed by fixed function hardware.

The pixel shader stage 316 calculates output values for screen pixels based on the primitives generated upstream and the results of rasterization. The pixel shader stage 316 may apply textures from texture memory. Operations for the pixel shader stage 316 are performed by a shader program that executes on the programmable processing units 202.

The output merger stage 318 accepts output from the pixel shader stage 316 and merges those outputs, performing operations such as z-testing and alpha blending to determine the final color for a screen pixel.

Texture data, which defines textures, are stored and/or accessed by the texture unit 320. Textures are bitmap images that are used at various points in the graphics processing pipeline 134. For example, in some instances, the pixel shader stage 316 applies textures to pixels to improve apparent rendering complexity (e.g., to provide a more "photorealistic" look) without increasing the number of vertices to be rendered.

In some instances, the vertex shader stage 304 uses texture data from the texture unit 320 to modify primitives to increase complexity, by, for example, creating or modifying vertices for improved aesthetics. In one example, the vertex shader stage 304 uses a height map stored in the texture unit 320 to modify displacement of vertices. This type of technique can be used, for example, to generate more realistic looking water as compared with textures only being used in the pixel shader stage 316, by modifying the position and number of vertices used to render the water. In some instances, the geometry shader stage 312 accesses texture data from the texture unit 320.

In order to increase compute efficiency in a GPU under memory bandwidth constraints (e.g., a bottleneck between the GPU and GPU memory), packets received by the GPU from a host processor (e.g., a central processing unit (CPU)) are compressed in some implementations.

In order to further increase compute efficiency, it may be desired to tailor the compression algorithm to the workload, and/or to update the compression algorithm as improved algorithms become available. Accordingly, the packets are analyzed to determine a corresponding compression algorithm in some implementations.

Implementing a plurality of compressors in application-specific silicon on the GPU (or accelerator including a GPU) from which to select based on workload has the disadvantage of incurring engineering costs up front, as well as significant die-area penalties, due to the need to implement separate compressors for each algorithm. This is particularly undesirable in cases where the potential workload is unknown, and some or all of the compressors may go unused (or be underutilized). Similar concerns also apply to packet analysis circuitry which may be implemented to detect patterns in the packet traffic.

Accordingly, some implementations implement a compression and/or analysis front-end using a FPGA block on the GPU, or an FPGA that is tightly integrated with the GPU (e.g., on the same die, or within the same package). This is referred to as an FPGA (e.g., an FPGA configured for analysis and/or compression/decompression) or an FPGA data handler in the examples below. As used herein, the FPGA or FPGA data handler is a communication interface between a communication bus and a processor, and in some cases includes compression, decompression, analysis and/or other capabilities. In some implementations, the FPGA or data handler includes hardware for receiving data (e.g., packets) from a bus (e.g., from a host processor) and forwarding the data to a processor (e.g., to a GPU), for receiving data from a processor (e.g., a GPU) and forwarding the data to a bus (e.g., to a host processor), and/or for analyzing, compressing, and/or such received data. It is noted that data, in this context, includes any information (or specific desired information), including control information, metadata, and so forth.

Figure 4:
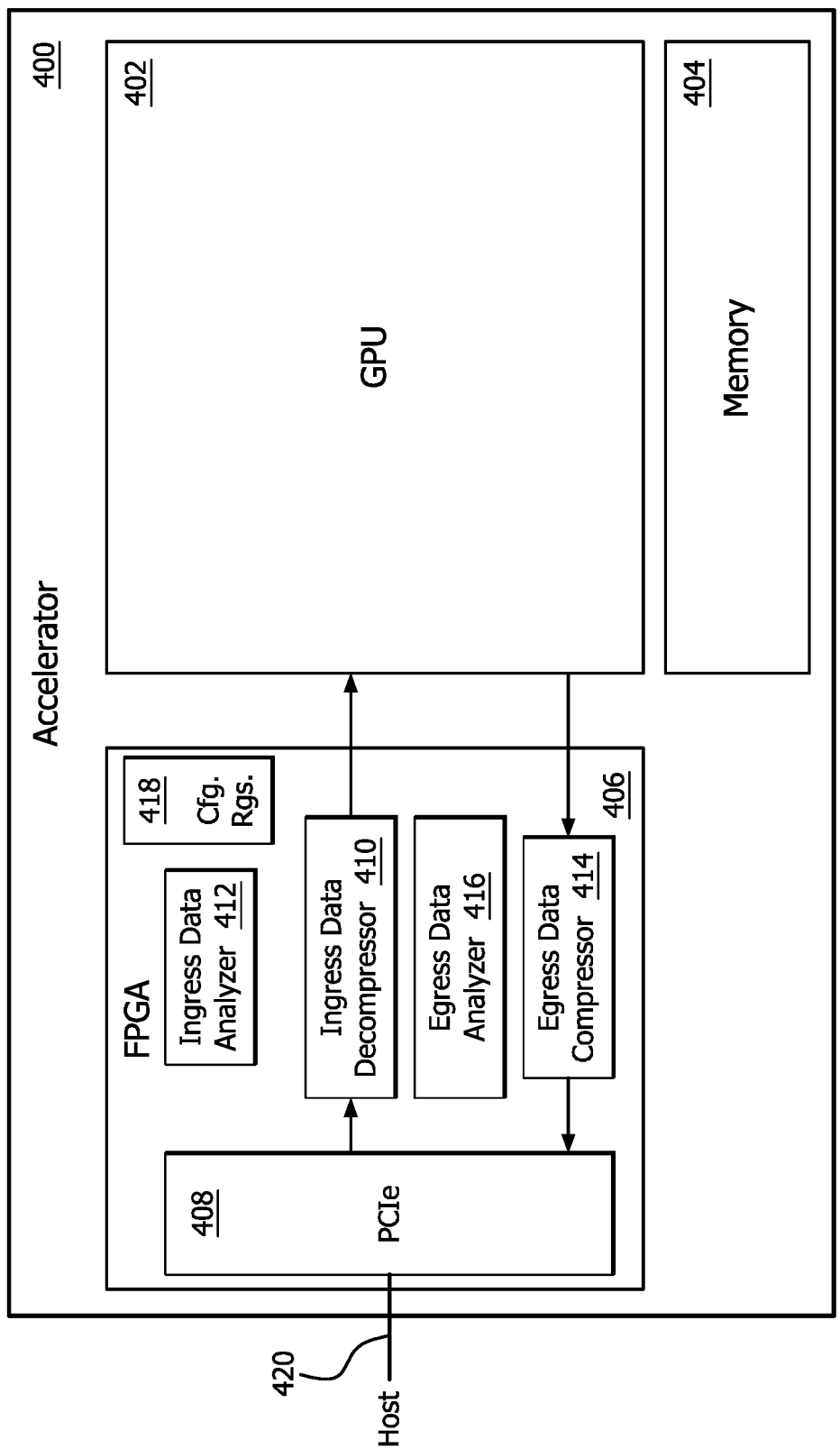
FIG. 4 is a block diagram of an example accelerator which illustrates an example FPGA configured for analysis and compression/decompression.

FIG. 4 is a block diagram of an example accelerator 400 which illustrates an example FPGA configured for information (e.g., data) analysis and compression/decompression. Example accelerator 400 is implemented with any suitable hardware and/or software, e.g., using APD 116 as shown and described with respect to FIGS. 1, 2, and 3, or portions thereof. Accelerator 400 is illustrated as configured for ingress information (e.g., data) decompression and egress information (e.g., data) compression for clarity (e.g., a case where data is compressed for transmission to the GPU, but where a GPU algorithm is unsuitable for computation on compressed data). It is noted that in other embodiments, an accelerator additionally, or alternately, includes ingress data compression and egress data decompression (e.g., a case where data is transmitted uncompressed to the GPU, but is compressed for computation on the GPU, e.g., such that the computations utilize less GPU memory bandwidth.)

Accelerator 400 includes a GPU 402, GPU memory 404, and FPGA 406. GPU 402, GPU memory 404, and/or FPGA 406 are implemented on the same die in some implementations. In other example implementations, GPU 402, GPU memory 404, and/or FPGA 406 are implemented on different dies within the same package, or on different dies in separate packages.

GPU 402 includes any suitable GPU, including, for example, GPUs implemented on discrete GPU cards, datacenter GPUs, and/or GPUs integrated with CPUs on the same die. GPU memory 404 includes any suitable GPU memory circuitry, such as dynamic random access memory (DRAM), spin-transfer torque random access memory (STT-RAM), or phase change memory (PCM). GPU 402 is in communication with GPU memory 404 over any suitable communications medium, such as a GPU memory bus (not shown), based on any suitable communications standard or technique, such as a Joint Electron Device Engineering Council (JEDEC™) Double Data Rate (DDR) Synchronous Dynamic Random-Access Memory (SDRAM) standard (e.g., JESD79F) or any other suitable standard. GPU 402 is in communication with a host CPU (or other host device) over any suitable medium (e.g., a Peripheral Component Interconnect Express (PCIe) bus), via FPGA 406. Such host device is implemented with any suitable hardware and/or software, e.g., using processor 102 as shown and described with respect to FIG. 1.

FPGA 406 facilitates data communication between a CPU host and GPU 402. In this example, FPGA 406 communicates with a host CPU via a PCIe bus 420, however any suitable communications medium is usable in other implementations. FPGA 406 includes a PCIe controller 408, ingress decompressor 410, ingress analyzer 412, egress compressor 414, and egress analyzer 416. In some implementations, the PCIe controller is implemented outside of FPGA 406, and PCIe controller 408 is omitted from the FPGA 406. Ingress decompressor 410, ingress analyzer 412, egress compressor 414, and egress analyzer 416 operate on packets in this example; however, this is illustrative of information generally. In some implementations, the ingress decompressor 410, ingress analyzer 412, egress compressor 414, and egress analyzer 416 operate on other kinds of information, such as other kinds of packets or non-packet information.

In some examples, ingress decompressor 410 and egress compressor 414 are functions of the same device (e.g., the same programmable logic block or combination of programmable logic blocks and interconnect) on FPGA 406. In other examples, ingress decompressor 410 and egress compressor 414 are implemented as separate devices on FPGA 406. In some examples, ingress analyzer 412 and egress analyzer 414 are functions of the same device on FPGA 406. In other examples, ingress decompressor 412 and egress analyzer 414 are implemented as separate devices on FPGA 406. Some other example implementations include only compression hardware, omitting the analyzer hardware, or include only analysis hardware omitting the compression hardware.

In some implementations, FPGA 406 includes configuration registers 418, e.g., for configuring PCIe controller 408, ingress decompressor 410, ingress analyzer 412, egress compressor 414, and/or egress analyzer 416. It is noted that FPGA 406 is configurable with any combination or subcombination of these devices, or other devices, in other implementations. Configuration registers 418 are implemented on FPGA handler 406 in this example, however in some examples the configuration registers are implemented off of the FPGA (e.g., on GPU 402 or memory 404).

PCIe controller 408 receives information (e.g., commands and data) from the host CPU over PCIe bus 420. PCIe controller 408 also forwards the information (e.g., commands and data) to the host CPU over PCIe bus 420. PCIe controller 408 is one example of a communications controller. In implementations where a different communications medium or standard (e.g., other than PCIe) is used, a different suitable controller is usable in place of, or in addition to, a PCIe controller.

Ingress decompressor 410 receives the information received by PCIe controller 408 and decompresses it according to a desired decompression scheme. The decompression scheme is suitable for decompressing the received information based on a compression scheme used to compress the information (e.g., at the transmitter). Example compression schemes include lossless and lossy compression schemes. Example lossless compression schemes includes bzip2 (lossless general purpose), Dolby TrueHD™ (lossless audio), and Portable Network Graphics (PNG) (lossless graphics). Example lossy compression schemes include mp3 (lossy audio), h.264 (lossy video), and Joint Photographic Experts Group (JPEG) (lossy image). Ingress decompressor 410 forwards the decompressed information to GPU 402 (and/or memory 404). Ingress decompressor 410 is configurable with different decompression schemes (or none). For example, in some implementations, circuitry (e.g., programmable logic blocks and/or reconfigurable interconnects of a programmable gate array) of ingress decompressor 410 is configured to instantiate a desired decompressor (e.g., according to any desired decompression algorithm). Ingress decompressor 410 is specified in any suitable manner, such as by a hardware description language (HDL). Reconfiguration of ingress decompressor 410 is initiated and carried out in any suitable manner. For example, in some implementations, FPGA 406 is reprogrammed (e.g., as an update, or at any other suitable time) to implement a different, or additional decompressor, as ingress decompressor 410. In some implementations, FPGA 406 is reprogrammed in response to a trigger received from ingress analyzer 412 (e.g., based on analysis of the information received from the host CPU), from the host CPU (e.g., based on or as part of an instruction stream), or any other suitable device.

Ingress analyzer 412 non-intrusively intercepts information received by PCIe controller 408 for analysis. For example, in some implementations, Ingress analyzer 412 receives packets from PCIe controller 408 and analyzes the packets to determine patterns in the packets. Packets (e.g., data packets, control packets, or other kinds of packets) are illustrative of information generally in this example; other types of packets or information are also analyzed, compressed, and/or decompressed in other examples. The packets include any suitable packets, such as PCIe transaction layer packets (TLP). Example patterns that are determinable by ingress analyzer 412 include data sparsity, repeating zeros, commonly-occurring patterns, and so forth. Ingress analyzer 412 captures such patterns as statistics or other information.

In some implementations, ingress analyzer 412 saves the statistics or other information relating to patterns in the packets, e.g., to configuration registers of FPGA 406. In some implementations, ingress analyzer 412 generates a prediction of patterns in future packets based on the statistics or other information. In some implementations, ingress analyzer 412 saves the prediction, e.g., to configuration registers of FPGA 406.

In some implementations, the ingress analyzer 412 makes the pattern and/or prediction information available to the host or other devices. For example, in some implementations, the host reads the configuration registers to retrieve this information, e.g., via a suitable API. In some implementations, FPGA 406 reports the information to the CPU host, e.g., periodically, or based on a signal such as a poll or interrupt.

Egress compressor 414 receives the information destined for PCIe controller 408 from GPU 402 (or GPU memory 404) and compresses it according to a desired compression scheme. Egress compressor 414 forwards the compressed information to PCIe controller 408 for transmission to the host processor. Egress compressor 414 is configurable with different compression schemes (or none). For example, in some implementations, circuitry (e.g., programmable logic blocks and/or reconfigurable interconnects of a programmable gate array) of egress compressor 414 is configured to instantiate a desired compressor (e.g., according to any desired compression algorithm). Egress compressor 414 is specified in any suitable manner, such as by a hardware description language (HDL).

Reconfiguration of egress compressor 414 is initiated and carried out in any suitable manner. For example, in some implementations, FPGA 406 is reprogrammed (e.g., as an update, or at any other suitable time) to implement a different, or additional compressor, as ingress decompressor 410. In some implementations, FPGA 406 is reprogrammed in response to a trigger received from egress analyzer 412 (e.g., based on analysis of the information received from GPU 402), from the host CPU (e.g., based on or as part of an instruction stream), or any other suitable device. For example, egress compressor 414 is reconfigurable to implement a desired zero-value decompression scheme responsive to a prediction that future packets from the GPU for egress to the host will include corresponding zero-value data and/or zero-value data patterns.

Egress analyzer 416 non-intrusively intercepts information received from GPU 402 for analysis. For example, in some implementations, egress analyzer 416 receives packets (e.g., packets, control packets, metadata packets, or other kinds of information) from GPU 402 and analyzes the packets to determine patterns in the packets. The packets include any suitable packets, such as a PCIe packet. Example patterns that are determinable by egress analyzer 416 include data sparsity, repeating zeros, commonly-occurring patterns, and so forth. Egress analyzer 416 captures such patterns as statistics or other information.

In some implementations, egress analyzer 416 saves the statistics or other information relating to patterns in the packets, e.g., to configuration registers of FPGA 406. In some implementations, egress analyzer 416 generates a prediction of patterns in future packets based on the statistics or other information. In some implementations, egress analyzer 416 saves the prediction, e.g., to configuration registers of FPGA 406.

In some implementations, the egress analyzer 416 makes the pattern and/or prediction information available to the host or other devices. For example, in some implementations, the host can read the configuration registers to retrieve this information, e.g., via a suitable API. In some implementations, FPGA 406 reports the information to the CPU host, e.g., periodically, or based on a signal such as a poll or interrupt.

Ingress decompressor 410 and/or egress compressor 414 are reconfigurable. For example, in some implementations, the compression and/or decompression algorithms are modified, initiated, or terminated, based on information in the configuration registers. In some examples, the ingress decompressor 410 and/or egress compressor 414 are configured with multiple compression and/or decompression algorithms, and a suitable algorithm is selected from among the configured algorithms based on information in the configuration registers.

In some examples, the selection is made based on predicted patterns in future packets (e.g., as made by ingress analyzer 412 and/or egress analyzer 416, by the host CPU, or otherwise). In some implementations, the selection and/or reconfiguration is made responsive to a signal, such as an instruction or packet. In some implementations, the host generates the signal to reconfigure or reprogram by predicting patterns in future packets, or based on a received prediction.

In some implementations, the ingress decompressor 410 and/or egress compressor 414 are reconfigured with one or more compression and/or decompression algorithms with which they are not currently configured. In some examples, the reconfiguration is performed by reprogramming FPGA 406 (e.g., responsive to predicted patterns in future packets).

Figure 5:
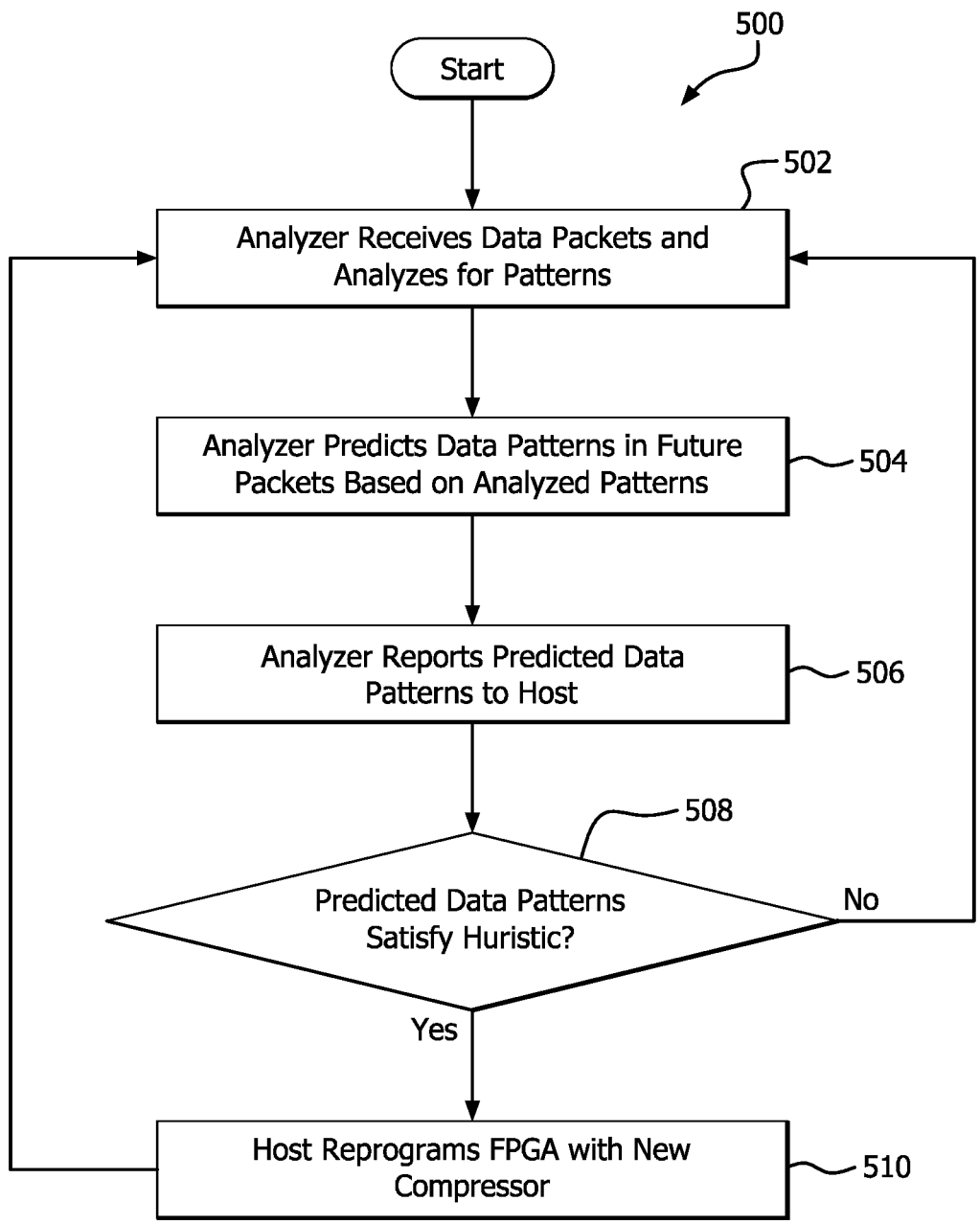
FIG. 5 is a flow chart illustrating example FPGA reconfiguration responsive to predicted patterns in information.

FIG. 5 is a flow chart illustrating an example procedure 500 for reconfiguring a FPGA (such as FPGA 406 shown and described with respect to FIG. 4) responsive to predicted data patterns in packets. In the example of FIG. 5, pattern detection and pattern prediction are carried out by the FPGA, and heuristic comparison and FPGA reprogramming are carried out by the host. This configuration is one example implementation. It is noted that in some embodiments, some of these functions are carried out by the corresponding other device. For example, other possible permutations of these configurations are described with respect to FIG. 6, and FIG. 7.

Referring again to FIG. 5, in step 502, the FPGA receives packets, and analysis circuitry of the FPGA analyzes the received packets for patterns (e.g., zero data patterns). In some implementations, the FPGA receives the packets over a bus from a host CPU for transmission to a GPU (e.g., "ingress data") and/or receives the packets from a GPU for transmission to a host CPU (e.g. "egress data"), e.g., as described with respect to FIG. 4). The packets are analyzed in any suitable manner, e.g., as described with respect to FIG. 4. For example, in some implementations, the analysis circuitry accumulates statistics or other information regarding characteristics of the packets, e.g., in one or more configuration registers, in GPU memory, or in any other suitable memory. In some implementations, such characteristics include data sparsity, repeating zeros, commonly-occurring patterns, zero-data patterns and so forth.

In step 504, the analysis circuitry determines a predicted data pattern in future packets based on the analyzed patterns in the received packets. For example, in some implementations, the analysis circuitry predicts characteristics of future packets based on the analyzed patterns in the received packets. In some implementations, such characteristics include data sparsity, repeating zeros, commonly-occurring patterns, zero-data patterns and so forth.

In step 506, the FPGA makes the pattern and/or prediction information available to the host or other devices (e.g., as shown and described with respect to FIG. 4). For example, in some implementations, the host reads the configuration registers to retrieve this information, e.g., via a suitable API. In some implementations, FPGA reports the information to the CPU host, e.g., periodically, or based on a signal such as a poll or interrupt.

The host (or other device) determines whether the pattern and/or prediction satisfies a heuristic (e.g., corresponds to a compression algorithm not implemented on the FPGA). On condition 508 that the predicted data pattern satisfies a heuristic, the host CPU reprograms the FPGA with a new compressor corresponding to the predicted data pattern in step 510 and procedure 500 continues dynamically from step 502. Otherwise, procedure 500 continues dynamically from step 502 without reprogramming of the FPGA. It is noted that procedure 500 completes in any suitable manner; e.g., on shutdown of the accelerator, in response to an express disablement command, or otherwise.

Figure 6:
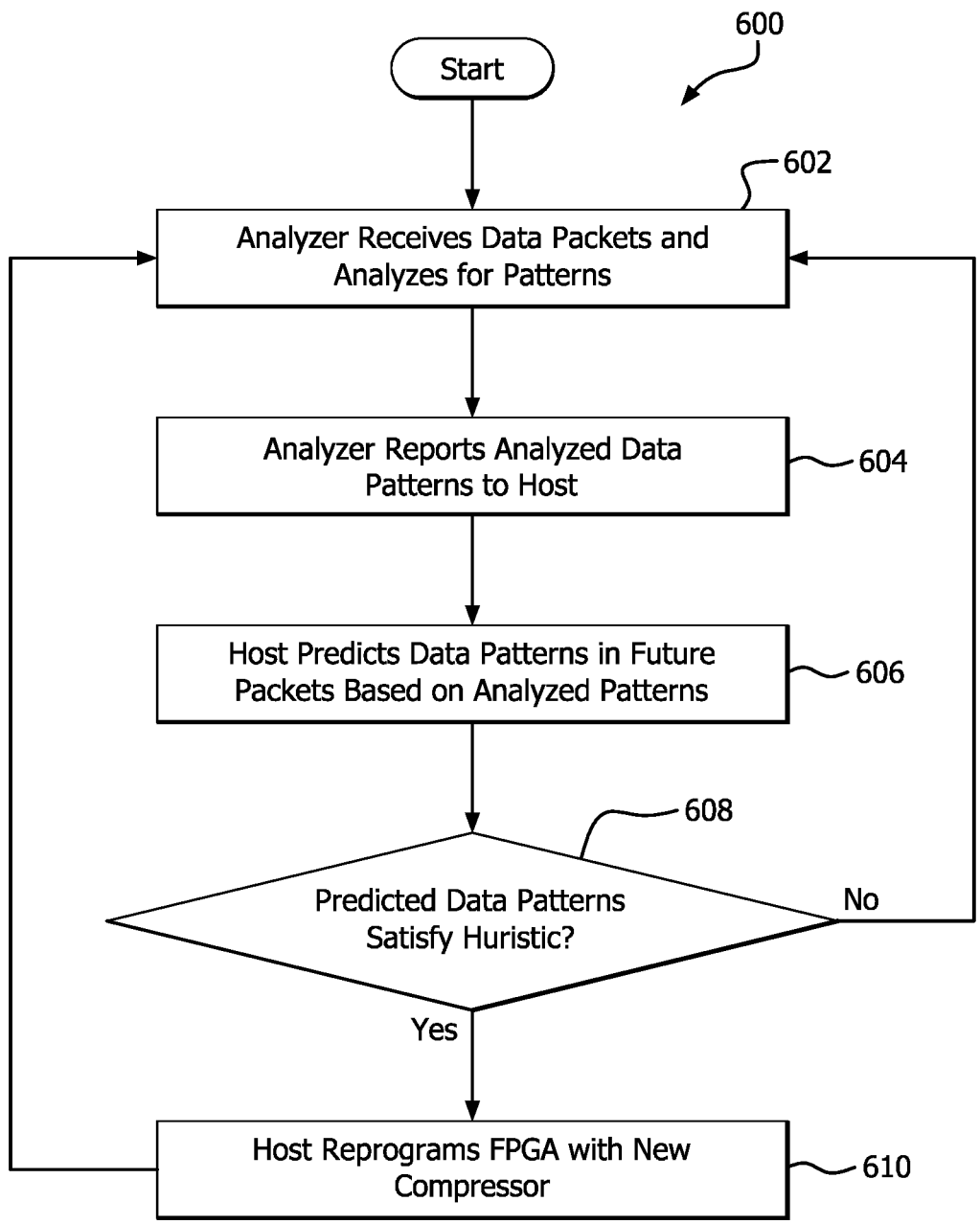
FIG. 6 is a flow chart illustrating another example FPGA reconfiguration responsive to predicted patterns in information.

FIG. 6 is a flow chart illustrating an example procedure 600 for reconfiguring a FPGA (such as FPGA 406 shown and described with respect to FIG. 4) responsive to predicted data patterns in packets. In the example of FIG. 6, pattern detection is carried out by the FPGA, and pattern prediction, heuristic comparison, and FPGA reprogramming are carried out by the host. This configuration is one example implementation.

In step 602, the FPGA receives packets, and analysis circuitry of the FPGA analyzes the received packets for patterns (e.g., zero data patterns). In some implementations, the FPGA receives the packets over a bus from a host CPU for transmission to a GPU (e.g., "ingress data") and/or receives the packets from a GPU for transmission to a host CPU (e.g. "egress data"), e.g., as described with respect to FIG. 4). The packets are analyzed in any suitable manner, e.g., as described with respect to FIG. 4. For example, in some implementations, the analysis circuitry accumulates statistics or other information regarding characteristics of the packets, e.g., in one or more configuration registers, in GPU memory, or in any other suitable memory. In some implementations, such characteristics include data sparsity, repeating zeros, commonly-occurring patterns, zero-data patterns and so forth.

In step 604, the analysis circuitry makes the pattern information available to the host or other devices (e.g., as shown and described with respect to FIG. 4). For example, in some implementations, the host reads the configuration registers to retrieve this information, e.g., via a suitable API. In some implementations, FPGA reports the information to the CPU host, e.g., periodically, or based on a signal such as a poll or interrupt.

In step 606, the host determines a predicted data pattern in future packets based on the analyzed patterns in the received packets. For example, in some implementations, the analysis circuitry predicts characteristics of future packets based on the analyzed patterns in the received packets. In some implementations, such characteristics include data sparsity, repeating zeros, commonly-occurring patterns, zero-data patterns and so forth.

The host (or other device) also determines whether the pattern and/or prediction satisfies a heuristic (e.g., corresponds to a compression algorithm not implemented on the FPGA). On condition 608 that the predicted data pattern satisfies a heuristic, the host CPU reprograms the FPGA with a new compressor corresponding to the predicted data pattern in step 610 and procedure 600 continues dynamically from step 602. Otherwise, procedure 600 continues dynamically from step 602 without reprogramming of the FPGA. It is noted that procedure 600 completes in any suitable manner; e.g., on shutdown of the accelerator, in response to an express disablement command, or otherwise.

Figure 7:
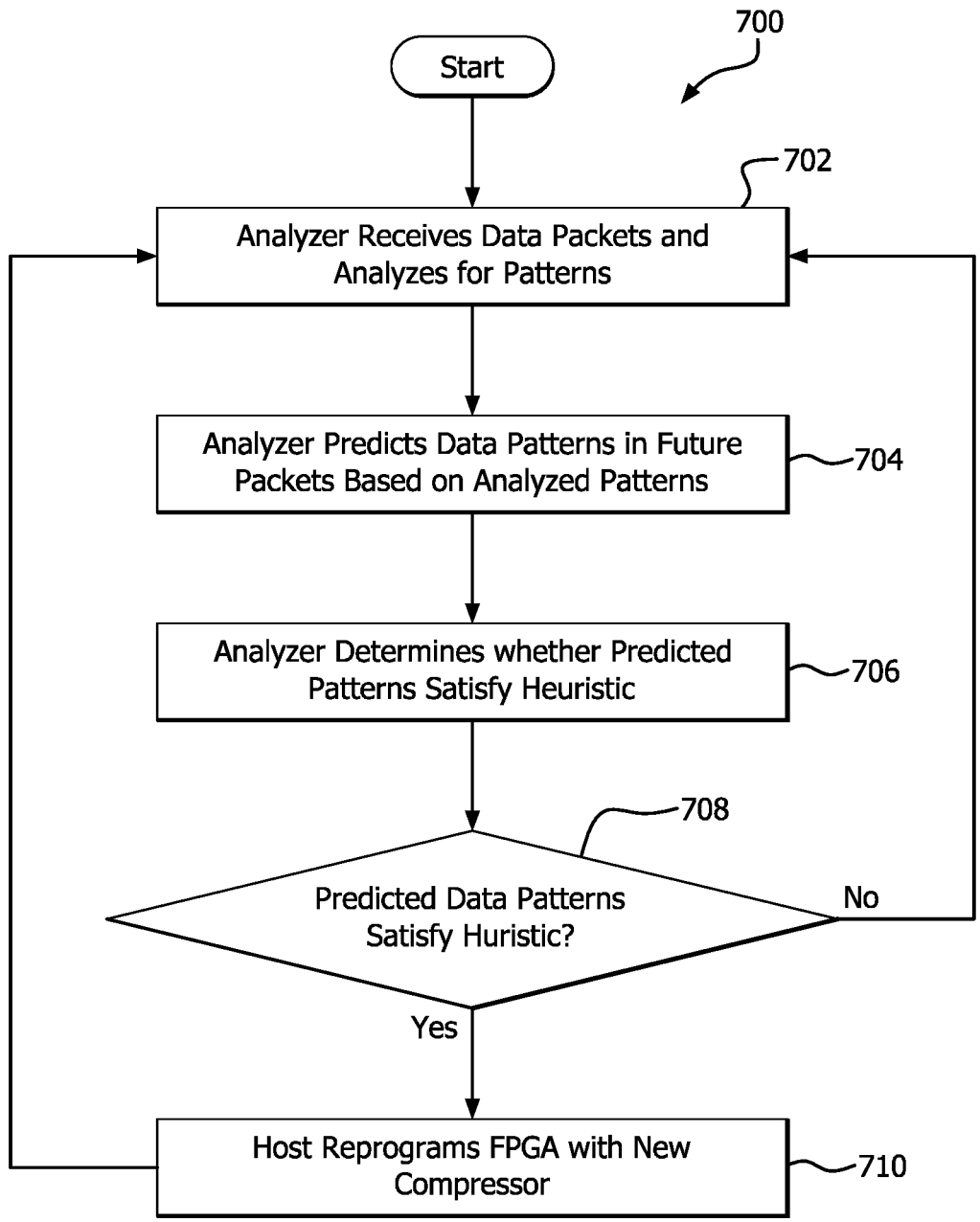
FIG. 7 is a flow chart illustrating another example FPGA reconfiguration responsive to predicted patterns in information.

FIG. 7 is a flow chart illustrating an example procedure 500 for reconfiguring a FPGA (such as FPGA 406 shown and described with respect to FIG. 4) responsive to predicted data patterns in packets. In the example of FIG. 7, pattern detection, pattern prediction, and heuristic comparison are carried out by the FPGA, and FPGA reprogramming is carried out by the host. This configuration is one example implementation.

In step 702, the FPGA receives packets, and analysis circuitry of the FPGA analyzes the received packets for patterns (e.g., zero data patterns). In some implementations, the FPGA receives the packets over a bus from a host CPU for transmission to a GPU (e.g., "ingress data") and/or receives the packets from a GPU for transmission to a host CPU (e.g. "egress data"), e.g., as described with respect to FIG. 4). The packets are analyzed in any suitable manner, e.g., as described with respect to FIG. 4. For example, in some implementations, the analysis circuitry accumulates statistics or other information regarding characteristics of the packets, e.g., in one or more configuration registers, in GPU memory, or in any other suitable memory. In some implementations, such characteristics include data sparsity, repeating zeros, commonly-occurring patterns, zero-data patterns and so forth.

In step 704, the analysis circuitry determines a predicted data pattern in future packets based on the analyzed patterns in the received packets. For example, in some implementations, the analysis circuitry predicts characteristics of future packets based on the analyzed patterns in the received packets. In some implementations, such characteristics include data sparsity, repeating zeros, commonly-occurring patterns, zero-data patterns and so forth.

In step 706, the FPGA determines whether the pattern and/or prediction satisfies a heuristic (e.g., corresponds to a compression algorithm not implemented on the FPGA). On condition 708 that the predicted data pattern satisfies a heuristic, the FPGA makes this information available to the host or other device. For example, in some implementations, the host reads the configuration registers to retrieve this information, e.g., via a suitable API. In some implementations, FPGA reports the information to the CPU host, e.g., periodically, or based on a signal such as a poll or interrupt.

Responsive to receiving the indication that the predicted data pattern satisfies a heuristic, the host CPU reprograms the FPGA with a new compressor corresponding to the predicted data pattern in step 510 and procedure 500 continues dynamically from step 502. Otherwise, procedure 500 continues dynamically from step 502 without reprogramming of the FPGA. It is noted that procedure 500 completes in any suitable manner; e.g., on shutdown of the accelerator, in response to an express disablement command, or otherwise.

It is noted that any other suitable permutations of pattern detection, pattern prediction, and FPGA reprogramming than illustrated in FIGS. 5, 6, and 7 are possible. For example, in some implementations, pattern detection, pattern prediction, heuristic comparison are carried out by the FPGA, and at least part of the FPGA reprogramming is also carried out by the FPGA.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, the SIMD units 138, accelerator 400, GPU 402, and/or FPGA 406 may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for information communication, the method comprising:

receiving, by information analysis circuitry of a field-programmable gate array (FPGA), information transmitted from a host to a graphics processing unit (GPU);

predicting, by the information analysis circuitry of the FPGA, a future pattern based on a pattern in the information to form a predicted information pattern;

transmitting, by transmitter circuitry of the FPGA, an indication of the predicted information pattern to the host; and responsive to a signal from the host based on the predicted information pattern, reprogramming the FPGA to implement decompression circuitry based on the predicted information pattern.

2. The method of claim 1, wherein the information comprises a plurality of packets.

3. The method of claim 1, wherein the predicted information pattern comprises a pattern in a plurality of packets.

4. The method of claim 1, wherein the predicted information pattern comprises a zero data pattern.

5. The method of claim 1, further comprising, responsive to the signal from the host, reprogramming the FPGA to implement compression circuitry based on the predicted information pattern.

6. The method of claim 5, further comprising compressing, by the compression circuitry, information transmitted from the GPU to the host.

7. The method of claim 1, wherein the host reprograms the FPGA to implement the decompression circuitry based on the predicted information pattern responsive to the signal.

8. The method of claim 1, wherein the FPGA reprograms the FPGA to implement the decompression circuitry based on the predicted information pattern responsive to the signal.

9. The method of claim 5, wherein the host reprograms the FPGA to implement the compression circuitry based on the predicted information pattern responsive to the signal.

10. The method of claim 5, wherein the FPGA reprograms the FPGA to implement the compression circuitry based on the predicted information pattern responsive to the signal.

11. A reconfigurable communications device comprising:
   a field-programmable gate array (FPGA);
   the FPGA including analysis circuitry configured to receive information from a host to a graphics processing unit (GPU) and form a predicted information pattern by predicting a further pattern based on a pattern in the information;
   the FPGA further including transmission circuitry further configured to transmit an indication of the predicted information pattern to the host; and
   the FPGA configured to be reprogrammed to implement decompression circuitry based on the predicted information pattern, responsive to a signal from the host.

12. The reconfigurable communications device of claim 11, wherein the information comprises a plurality of packets.

13. The reconfigurable communications device of claim 11, wherein the predicted information pattern comprises a pattern in a plurality of packets.

14. The reconfigurable communications device of claim 11, wherein the predicted information pattern comprises a zero data pattern.

15. The reconfigurable communications device of claim 11, wherein the FPGA is configured to be reprogrammed, responsive to the signal from the host, to implement compression circuitry based on the predicted information pattern.

16. The reconfigurable communications device of claim 15, wherein the compression circuitry is configured to compress information transmitted from the GPU to the host.

17. The reconfigurable communications device of claim 11, wherein the FPGA is configured to be reprogrammed by the host to implement the decompression circuitry based on the predicted information pattern responsive to the signal.

18. The reconfigurable communications device of claim 11, wherein the FPGA is configured to be reprogrammed by the FPGA to implement the decompression circuitry based on the predicted information pattern responsive to the signal.

19. The reconfigurable communications device of claim 15, wherein the FPGA is configured to be reprogrammed by the host to implement the compression circuitry based on the predicted information pattern responsive to the signal.

20. The reconfigurable communications device of claim 15, wherein the FPGA is configured to be reprogrammed by the FPGA to implement the compression circuitry based on the predicted information pattern responsive to the signal.

* * * * *